(12) United States Patent
Liu

(10) Patent No.: US 10,923,674 B1
(45) Date of Patent: Feb. 16, 2021

(54) COLOR FILM SUBSTRATE AND PREPARATION METHOD THEREFOR, AND DISPLAY PANEL AND DISPLAY DEVICE

(71) Applicant: BOE Technology Group Co., Ltd., Beijing (CN)

(72) Inventor: Wei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/617,015

(22) PCT Filed: Apr. 19, 2019

(86) PCT No.: PCT/CN2019/083498
§ 371 (c)(1),
(2) Date: Nov. 26, 2019

(87) PCT Pub. No.: WO2019/201338
PCT Pub. Date: Oct. 24, 2019

(30) Foreign Application Priority Data

Apr. 20, 2018 (CN) .......................... 201810358565.5

(51) Int. Cl.
*H01L 51/52* (2006.01)
*H01L 27/32* (2006.01)
*H01L 51/56* (2006.01)

(52) U.S. Cl.
CPC ........ *H01L 51/5228* (2013.01); *H01L 27/322* (2013.01); *H01L 51/5284* (2013.01); *H01L 51/56* (2013.01)

(58) Field of Classification Search
None
See application file for complete search history.

(56) References Cited

U.S. PATENT DOCUMENTS 6,812,637 B2   11/2004   Cok et al.
10,497,759 B2 *  12/2019   Song .................... H01L 27/322
(Continued)

FOREIGN PATENT DOCUMENTS

CN   103700688 A   4/2014
CN   107342370 A   11/2017
(Continued)

*Primary Examiner* — J. E. Schoenholtz
(74) *Attorney, Agent, or Firm* — Arent Fox LLP; Michael Fainberg

(57) ABSTRACT

A color film substrate and a preparation method therefor, and a display panel and a display device comprising the color film substrate. The color film substrate comprises: an auxiliary cathode layer formed on a substrate; a black matrix layer formed on the auxiliary cathode layer, a plurality of first via holes penetrating through the black matrix layer in a direction vertical to the substrate being provided on the black matrix layer; a flat layer formed on the black matrix layer, a plurality of second via holes having one-to-one correspondence to the first via holes so as to expose the auxiliary cathode layer being provided on the flat layer; a plurality of spacers formed on the flat layer; and a transparent conductive layer formed on the spacers, the transparent conductive layer being connected to the auxiliary cathode layer by means of the second via holes.

19 Claims, 4 Drawing Sheets

(56) References Cited

U.S. PATENT DOCUMENTS

| | | | |
|---|---|---|---|
| 2015/0028343 A1* | 1/2015 | Li | H01L 27/1259 257/72 |
| 2015/0331161 A1 | 11/2015 | Wang et al. | |
| 2016/0155992 A1* | 6/2016 | Wang | G02F 1/133512 257/40 |
| 2019/0115546 A1 | 4/2019 | Lu et al. | |

FOREIGN PATENT DOCUMENTS

| | | |
|---|---|---|
| CN | 107706226 A | 2/2018 |
| CN | 107845662 A | 3/2018 |
| CN | 108336125 A | 7/2018 |
| CN | 208014705 U | 10/2018 |

* cited by examiner

COLOR FILM SUBSTRATE AND PREPARATION METHOD THEREFOR, AND DISPLAY PANEL AND DISPLAY DEVICE

This disclosure is a US National Stage of International Application No. PCT/CN2019/083498, filed Apr. 19, 2019, which claims the priority to Chinese Patent Application No. 201810358565.5 filed with the Chinese Patent Office on Apr. 20, 2018, and entitled"Color Film Substrate and Fabrication Method thereof, Display Panel and Display Device", the content of which is hereby incorporated by reference in its entirety.

FIELD

The present disclosure relates to the technical field of display, particularly relates to a color film substrate and a fabrication method thereof, a display panel and a display device.

BACKGROUND

In the development of large-scale active-matrix organic light-emitting diode (AMOLED) display panels, a technical solution of top emission may improve resolution of the display panels, so the technical solution has been studied deeply gradually. Because of the limitation of the cathodic conductivity and manufacturing thickness, the AMOLED display panel for large-scale display needs an auxiliary cathode to reduce the overall cathode resistance, to avoid voltage drop and improve the display quality of the display panel.

In the related art, the auxiliary cathode is generally provided on a color film substrate, and the technological difficulty of preparing the auxiliary cathode on the color film substrate is quite large. The main difficulty is that the production conditions of the auxiliary cathode are limited to other structures on the color film substrate, and have great impact on the performance of other film layers. Therefore, the fabrication of the auxiliary cathode is a difficult problem to be solved urgently.

SUMMARY

The present disclosure provides a color film substrate and a fabrication method thereof, a display panel and a display device to reduce the technological difficulty of preparing an auxiliary cathode layer, to ensure good performance of each film layer of the color film substrate, and to simplify the whole fabrication process of the color film substrate.

To achieve the above purpose, the present disclosure provides the following technical solution.

The present disclosure provides a color film substrate electroluminescent diode, including: a base substrate; an auxiliary cathode layer arranged on the base substrate and configured to couple to a cathode of the electroluminescent diode; a black matrix layer arranged on the auxiliary cathode layer, and the black matrix layer including a plurality of first via holes penetrating through the black matrix layer in a direction perpendicular to the base substrate to expose the auxiliary cathode layer; a flat layer arranged on the black matrix layer, and the flat layer including a plurality of second via holes corresponding to the first via holes one by one to expose the auxiliary cathode layer; a plurality of spacers arranged at intervals on the flat layer, where the spacers are at positions other than the first via holes in the black matrix layer; and a transparent conductive layer arranged on the spacers, wherein the transparent conductive layer is connected with the auxiliary cathode layer through the first via holes and the second via holes.

Optionally, the color film substrate also includes a color film layer arranged on the same layer as the black matrix layer.

Optionally, the auxiliary cathode layer includes a graphic identification for alignment and an auxiliary cathode grid routing, and the auxiliary cathode grid routing corresponds to the black matrix layer and is connected with the transparent conductive layer through the first via holes and the second via holes.

Optionally, the first via holes correspond to the intersections in the auxiliary cathode grid routing.

Optionally, an orthographic projection of the graphic identification on the base substrate is located on a corner of the base substrate.

The present disclosure also provides a display panel, including any color film substrate provided in the above technical solution.

The present disclosure also provides a display device, including any display panel provided in the above technical solution.

In addition, the present disclosure also provides a method of fabricating a color film substrate in electroluminescent diode. The method includes: depositing metal on the base substrate to form a metal layer, and patterning the metal layer to form an auxiliary cathode layer configured to couple to a cathode of the electroluminescent diode; forming a black matrix layer on the auxiliary cathode layer and a plurality of first via holes in the black matrix layer penetrating through the black matrix layer in a direction perpendicular to the base substrate to expose the auxiliary cathode layer; forming a flat layer on the black matrix layer and a plurality of second via holes in the flat layer corresponding to the first via holes one by one to expose the auxiliary cathode layer; forming a plurality of spacers at intervals on the flat layer, where the spacers are at positions other than the first via holes in the black matrix layer; and forming a transparent conductive layer on the spacers, where the transparent conductive layer is connected with the auxiliary cathode layer through the first via holes and the second via holes.

Optionally, after forming the black matrix layer and before forming the flat layer, the method further includes: forming a color film layer on the same layer as the black matrix layer.

Optionally, the auxiliary cathode layer includes a graphic identification for alignment and an auxiliary cathode grid routing. The auxiliary cathode grid routing corresponds to the black matrix layer and is connected with the transparent conductive layer through the first via holes and the second via holes.

DETAILED DESCRIPTION OF THE EMBODIMENTS

The technical solution in embodiments of the present disclosure will be described clearly and completely in conjunction with the drawings in the embodiments of the present disclosure. Obviously, the embodiments described are only part of the embodiments of the present disclosure. Based on the embodiments in the present disclosure, all other embodiments acquired by those of ordinary skilled in the field without making creative work fall within the scope of the protection of the present disclosure.

Figure 5:
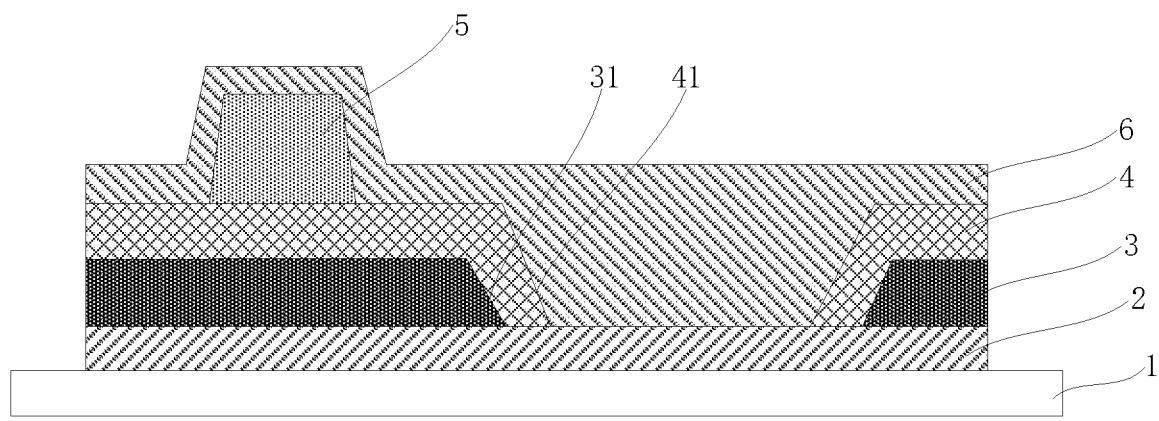

FIG. 5 is a schematic diagram of a local structure of a color film substrate provided in embodiments of the present disclosure. The color film substrate includes: a base substrate 1; an auxiliary cathode layer 2 arranged on the base substrate 1; a black matrix layer 3 arranged on the auxiliary cathode layer 2, where the black matrix layer 3 includes a plurality of first via holes 31 penetrating through the black matrix layer 3 in a direction perpendicular to the base substrate 1 to expose the auxiliary cathode layer 2; a flat layer 4 arranged on the black matrix layer 3, where the flat layer 4 includes a plurality of second via holes 41 corresponding to the first via holes 31 one by one to expose the auxiliary cathode layer 2; a plurality of spacers 5 arranged at intervals on the flat layer 4, where the spacers 5 correspond to positions other than the first via holes 31 in the black matrix layer 3; and a transparent conductive layer 6 arranged on the spacers 5, where the transparent conductive layer 6 is connected with the auxiliary cathode layer 2 through the first via holes 31 and the second via holes 41.

As shown in FIGS. 1-5, in the above-mentioned color film substrate, the auxiliary cathode layer 2 is provided on the base substrate 1 as the first layer, and the black matrix layer 3 is provided on the auxiliary cathode layer 2 and corresponds to the auxiliary cathode layer 2. The black matrix layer 3 includes a plurality of first via holes 31 penetrating through the black matrix layer 3 in a direction perpendicular to the base substrate 1. The auxiliary cathode layer 2 may be reached through the first via holes 31 in the black matrix layer 3, and the auxiliary cathode layer 2 may be exposed.

The flat layer 4 is arranged on the black matrix layer 3. The flat layer 4 may be an organic film layer. The flat layer 4 includes a plurality of second via holes 41 corresponding to the first via holes 31 one by one. Each pair of the first via hole 31 and the second via hole 41 may be nested holes. The auxiliary cathode layer 2 may be reached through the second via holes 41 penetrating through the flat layer 4, and the auxiliary cathode layer 2 may be exposed. The flat layer 4 includes a plurality of spacers 5 arranged at intervals, and the spacers 5 correspond to positions other than the first via holes 31 in the black matrix layer 3. The spacers 5 are provided on the flat layer 4. The flat layer 4 is an organic film layer. The spacers 5 are connected with the flat layer 4, and the adhesion of the spacers 5 with the flat layer 4 may be increased to avoid the falling off of the spacers 5.

The transparent conductive layer 6 is arranged on the spacers 5, and is contacted and connected with the auxiliary cathode layer 2 through the first via holes 31 and the second via holes 41. The auxiliary cathode layer 2 is electrically connected with the transparent conductive layer 6, then the transparent cathode layer is electrically connected with the cathode after the cell aligning of the color film substrate is completed, that is, the auxiliary cathode layer 2 may be electrically connected with the cathode to reduce the cathode resistance, to avoid voltage drop and to improve the display effect of the display panel.

In the structure of the above-mentioned color film substrate, compared with the related art, the auxiliary cathode layer 2, used as the first layer on the base substrate 1, is prepared before other film layers, and does not need more peculiar conditions and requirements in the fabrication process due to the consideration of the performance and fabrication conditions of other film layers, thus the technological difficulty of preparing the auxiliary cathode layer 2 may be reduced.

For example, as the first layer, the auxiliary cathode layer 2 may be prepared at first by high temperature deposition, which is conducive to improving the physical properties of the auxiliary cathode layer 2.

Moreover, because there is no organic film on the base substrate 1 during the sputtering deposition of the auxiliary cathode metal, the chamber of sputtering deposition equipment will not be polluted.

In addition, preparing other film layers after the fabrication of the auxiliary cathode layer 2 may avoid affecting other film layers in the fabrication process of the auxiliary cathode layer 2, which is beneficial to ensuring constant sound performance of other film layers.

In addition, for the whole fabrication process of the color film substrate, based on the film layer structure arrangement of the color film substrate provided in the embodiment of the present disclosure, the complexity of the whole fabrication process of the color film substrate is reduced, that is, the fabrication process is simplified and the fabrication cost is reduced.

In summary, in the color film substrate, the auxiliary cathode layer 2 provided on the base substrate 1 as the first layer reduces the technological difficulty of preparing the auxiliary cathode layer 2. The metal material of the auxiliary cathode layer 2 may be deposited at high temperature, which is conducive to improving the physical properties of the auxiliary cathode layer 2 and avoiding the influence of the fabrication process of the auxiliary cathode layer 2 on other film layers, so as to ensure the sound performance of other film layers. Furthermore, the spacers 5 are provided on the flat layer 4 and are connected with the flat layer 4, and the adhesion of the spacers 5 with the flat layer 4 may be increased to avoid the falling off of the spacers 5. Furthermore, based on the film layer structure arrangement of the color film substrate provided in the embodiments of the present disclosure, the whole fabrication process of the color film substrate is simplified and the fabrication cost is reduced.

Figure 6:
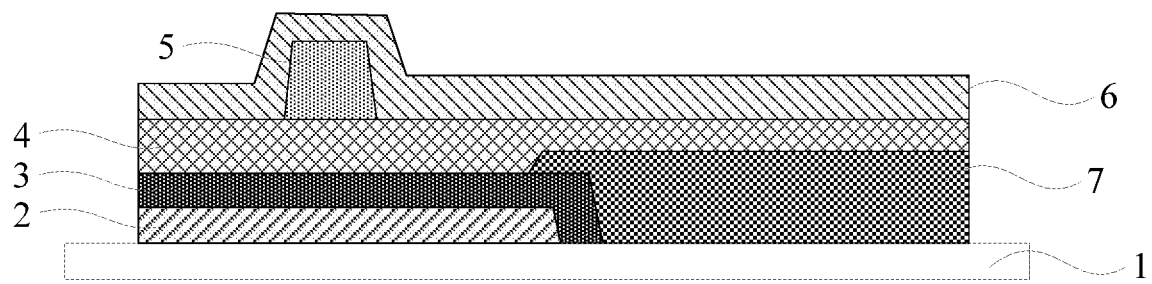
FIG. 6 is a schematic diagram of the structure of a local film layer of a color film substrate provided in embodiments of the present disclosure.

Specifically, as shown in FIG. 6, the color film substrate also includes a color film layer 7 provided on the same layer as the black matrix layer 3.

Figure 7:
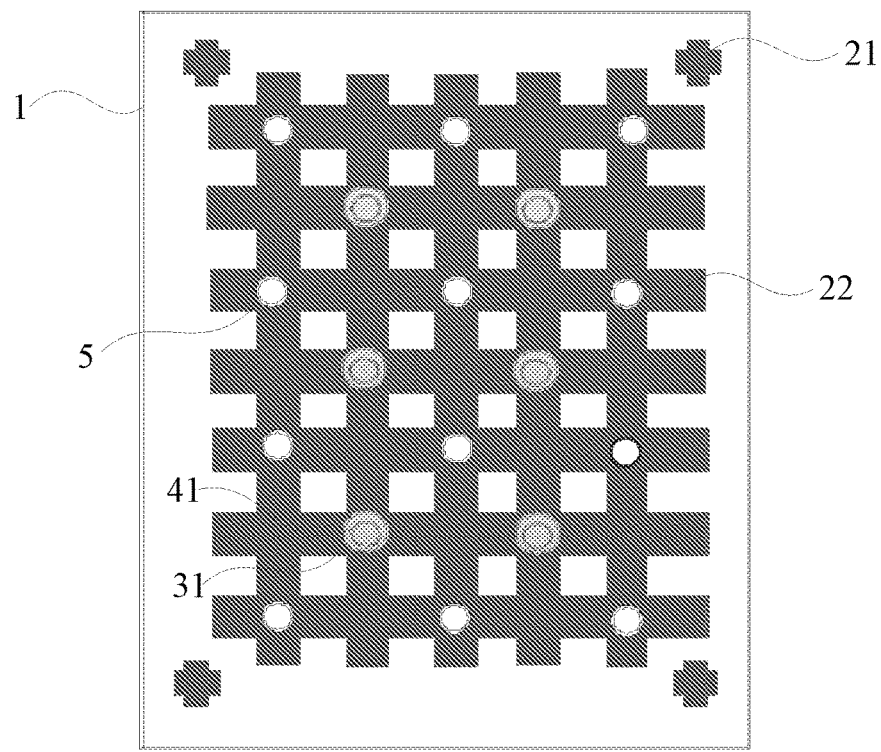
FIG. 7 is a top view of the structure of a color film substrate provided in embodiments of the present disclosure.

Specifically, as shown in FIG. 7, the auxiliary cathode layer 2 includes a graphic identification 21 for alignment and an auxiliary cathode grid routing 22. Provided in the auxiliary cathode layer 2, the graphic identification 21 for alignment is used to align an exposure machine with the graphic identification when the film layer is patterned in the subsequent film layer fabrication process, so as to avoid the deviation of the subsequently prepared film layers; the auxiliary cathode grid routing 22 in the auxiliary cathode layer 2 corresponds to the black matrix layer 3 and is electrically connected with the transparent conductive layer 6 through the first via holes 31 and the second via holes 41. After the cell aligning of the color film substrate provided in the embodiments of the present disclosure is completed, the auxiliary cathode grid routing 22 is electrically connected with the cathode through the transparent conductive layer 6, so as to reduce cathode resistance, to avoid voltage drop and to improve the display quality of the formed display panel.

Figure 8:
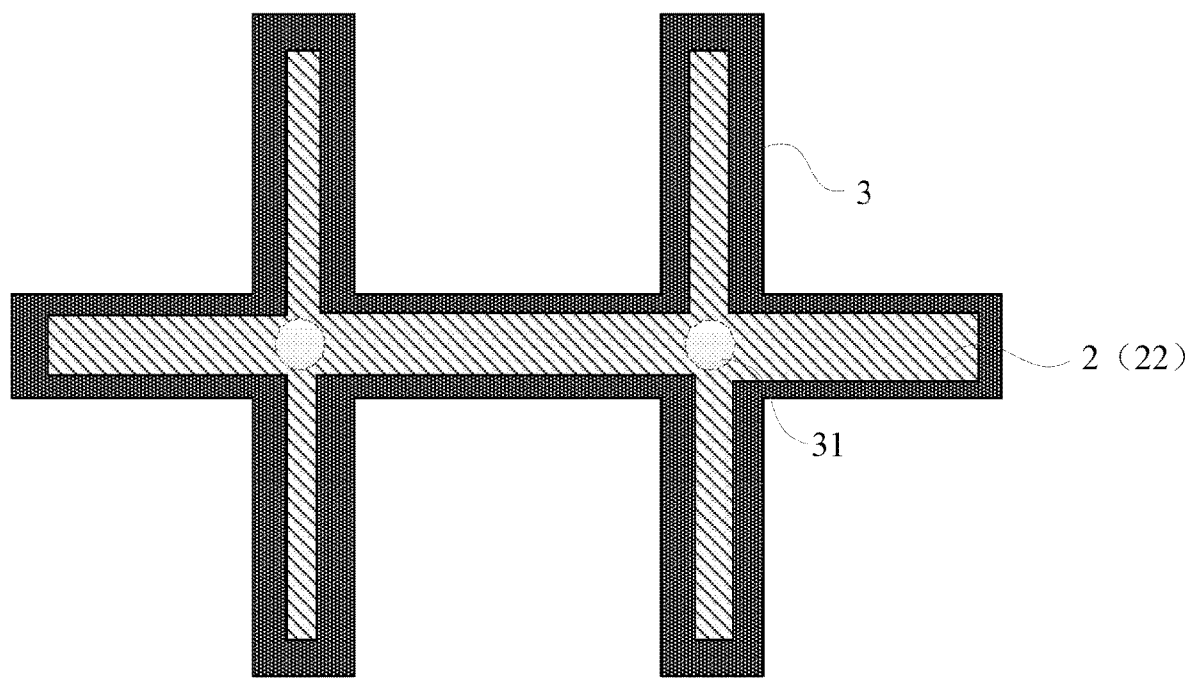
FIG. 8 is a top view of a local structure of a black matrix layer and an auxiliary cathode layer of a color film substrate provided in embodiments of the present disclosure.

Specifically, as shown in FIG. 8, the auxiliary cathode grid routing 22 of the auxiliary cathode layer 2 corresponds to the black matrix layer 3, that is, the auxiliary cathode grid routing 22 is located in the area where the black matrix layer 3 is located, and at least partially overlaps with the area where the black matrix layer 3 is located. As shown in FIGS. 7 and 8, the black matrix layer 3 is grid-shaped and covers the auxiliary cathode grid routing 22. The first via holes 31 are located at the intersections in the black matrix layer 3, and the first via holes 31 in the black matrix layer 3 correspond to the intersections in the auxiliary cathode grid routing 22, which is conducive to ensuring the structural stability of the black matrix layer 3.

As shown in FIG. 7, the orthographic projection of the graphic identification 21 in the auxiliary cathode layer 2 on the base substrate 1 is located in the corner of the base substrate 1. The graphic identification is provided in a corner of the auxiliary cathode layer 2, which is convenient for alignment during the subsequent fabrication process of the film layer and will not affect the auxiliary cathode layer 2.

Specifically, as shown in FIG. 7, the spacers 5 in the color film substrate are arranged at a certain density and a moderate size, and the transparent conductive layer 6 may contact with the cathode in the case of cell aligning. As an example, the spacer 5 may be a spacer column with a circular cross section. For example, the spacer 5 may be arranged as a cylindrical spacer column for the convenience of fabrication, and may also be arranged as a spacer column with a circular truncated cone shape, and the diameter of the circular surface of the circular truncated cone-shaped spacer column toward the flat layer 4 is larger than that of the circular surface toward the transparent cathode layer, so that the contact surface between the spacer columns and the flat layer 4 may be quite large to ensure firm connection with the flat layer 4, and to increase the stability of the spacer columns. It shall be noted that the spacers 5 may also be arranged as other shapes without limitation in this embodiment.

The embodiment of the present disclosure also provides a display panel, including any color film substrate provided in the above embodiments.

The embodiment of the present disclosure also provides a display device, including any display panel provided in the above embodiment.

Figure 9:
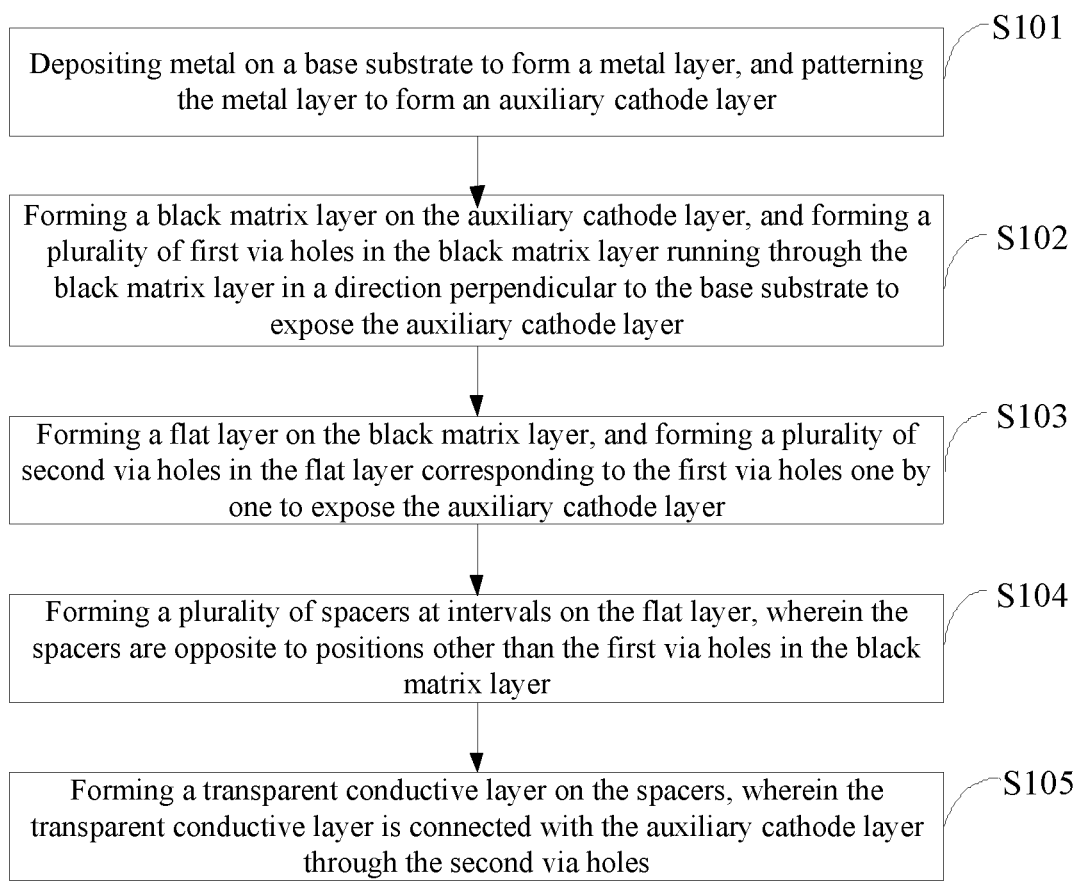
FIG. 9 is a flowchart of a fabrication method of a color film substrate provided in embodiments of the present disclosure.

As shown in FIG. 9 in conjunction with FIGS. 1-5, the embodiments of the present disclosure also provide a fabrication method of a color film substrate. The method includes the following steps.

Figure 1:
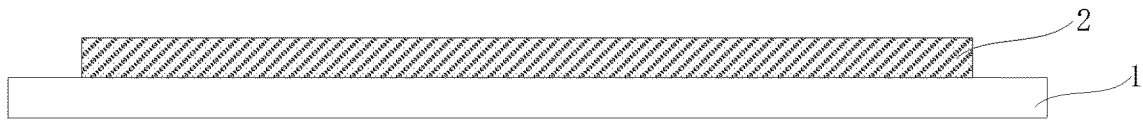
FIGS. 1-5 are schematic diagrams of changes in a local film layer in the fabrication process of a color film substrate provided in embodiments of the present disclosure.

S101: forming a metal layer by depositing metal on a base substrate 1, and patterning the metal layer to form an auxiliary cathode layer 2, as shown in FIG. 1.

Figure 2:
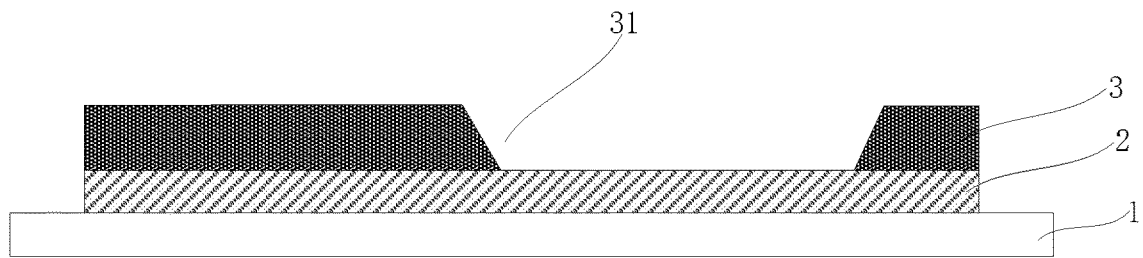

S102: forming a black matrix layer 3 on the auxiliary cathode layer 2, and a plurality of first via holes 31 in the black matrix layer 3 penetrating through the black matrix layer 3 in a direction perpendicular to the base substrate 1 to expose the auxiliary cathode layer 2, as shown in FIG. 2.

Figure 3:
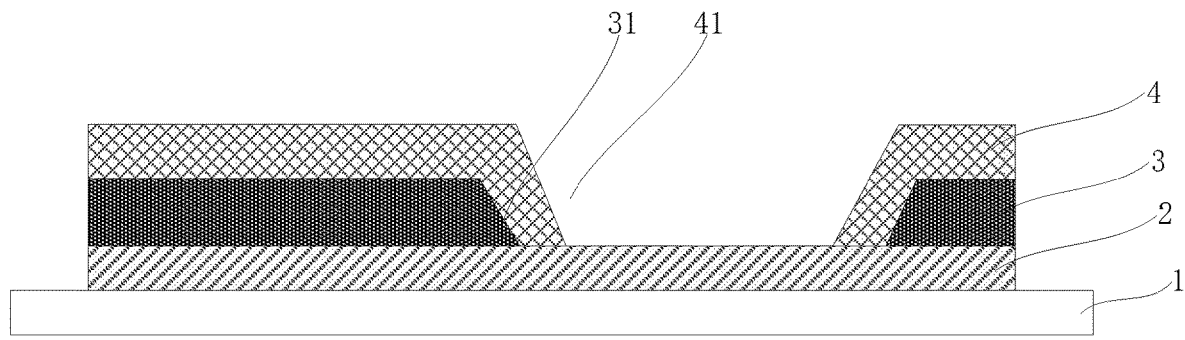

S103: forming a flat layer 4 on the black matrix layer 3 and a plurality of second via holes 41 in the flat layer 4 corresponding to the first via holes 31 one by one to expose the auxiliary cathode layer 2, as shown in FIG. 3.

Figure 4:
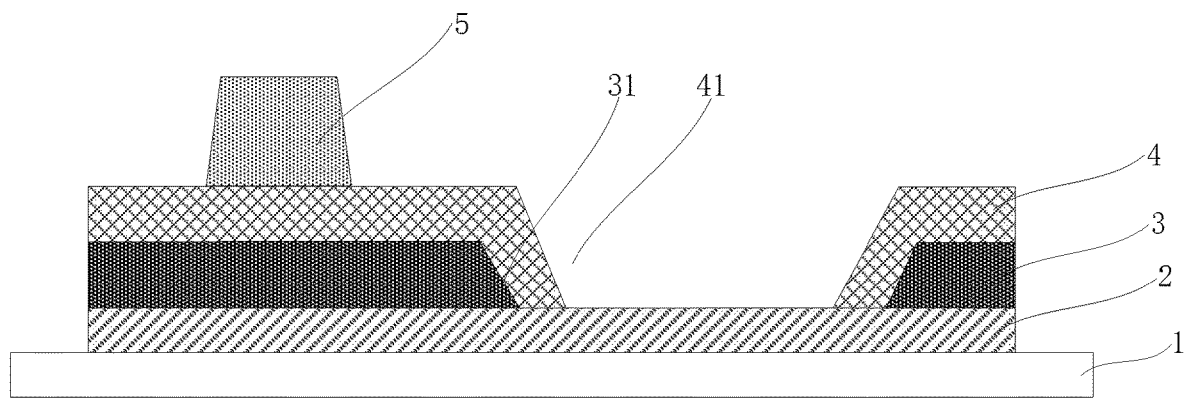

S104: forming a plurality of spacers 5 at intervals on the flat layer 4, where the spacers 5 are opposite to positions other than the first via holes 31 in the black matrix layer 3, as shown in FIG. 4.

S105: forming a transparent conductive layer 6 on the spacers 5, where the transparent conductive layer 6 is connected with the auxiliary cathode layer 2 through the first via holes 31 and the second via holes 41, as shown in FIG. 5.

In the related art, the auxiliary cathode layer is mostly directly prepared on the flat layer of an existing color film substrate to obtain a color film substrate with an auxiliary cathode layer.

In contrast, in the fabrication method of the color film substrate provided in the embodiments of the present disclosure, the auxiliary cathode layer 2 is firstly prepared on the base substrate 1 without considering its influence on other film layers, thus the technological difficulty of preparing the auxiliary cathode layer 2 may be reduced. And when auxiliary cathode metal is deposited, high temperature deposition may be adopted, which is helpful to improve the physical properties of the auxiliary cathode layer 2 and to avoid affecting other film layers during the fabrication process of the auxiliary cathode layer 2, ensuring that the performance of other film layers remains good. Moreover, by arranging the spacers 5 on the flat layer 4, and connecting the spacers 5 with the flat layer 4, the adhesion of the spacers 5 may be increased and the falling off of the spacers 5 may be avoided. In addition, the fabrication method of the color film substrate provided in the embodiments of the present disclosure simplifies the whole fabrication process of the color film substrate and reduces the fabrication cost.

Specifically, the fabrication method of the color film substrate, after forming the black matrix layer 3 and before forming the flat layer 4, also includes: forming a color film layer 7, which is arranged on the same layer as the black matrix layer 3, as shown in FIG. 6. The black matrix layer 3 is a grid pattern, which is used to define sub-pixel light-emitting arrays. The subsequently prepared color film arrays of different colors correspond to sub-pixels. After preparing of the color film arrays of different sub-pixels, the coating of the flattened organic film layer is performed.

In the fabrication method of the color film substrate, the auxiliary cathode layer 2 includes a graphic identification for alignment and an auxiliary cathode grid routing, the auxiliary cathode grid routing corresponds to the black matrix layer 3 and is connected with the transparent conductive layer 6 through the first via holes 31 and the second via holes 41. The graphic identification for alignment in the auxiliary cathode layer 2 may be used to align an exposure machine with the graphic identification when the film layer is patterned in the subsequent film layer fabrication process to avoid the deviation of the subsequently prepared film layer. The auxiliary cathode grid routing in the auxiliary cathode layer 2 corresponds to the black matrix layer 3 and is electrically connected with the transparent conductive layer 6 through the first via holes 31 and the second via holes 41. The color film substrate provided in the embodiments of the present disclosure will be electrically connected with the cathode after the cell aligning, thereby reducing the cathode resistance, avoiding voltage drop and improving the display quality of the formed display panel. Compared with a fabrication method of a color film substrate of the related art, in the fabrication method of the color film substrate provided in the embodiments of the present disclosure, the auxiliary cathode layer 2 includes the graphic identification and the auxiliary cathode grid routing without additional production of a graphic identification for alignment, the overall fabrication process is simple and the fabrication cost is low.

Obviously, those skilled in the art may make various changes and variations to the embodiments of the present disclosure without departing from the spirit and scope of the present disclosure. Thus, if these modifications and variations of the present disclosure fall within the scope of the claims of the present disclosure and their equivalent technologies, the present disclosure is also intended to include these modifications and variations.

The invention claimed is:

1. A color film substrate in electroluminescent diode, comprising:
 a base substrate;
 an auxiliary cathode layer arranged on the base substrate and configured to couple to a cathode of the electroluminescent diode;
 a black matrix layer arranged on the auxiliary cathode layer, and the black matrix layer comprising a plurality of first via holes penetrating through the black matrix layer in a direction perpendicular to the base substrate to expose the auxiliary cathode layer;
 a flat layer arranged on the black matrix layer, and the flat layer comprising a plurality of second via holes corresponding to the first via holes one by one to expose the auxiliary cathode layer;
 a plurality of spacers arranged at intervals on the flat layer, wherein the spacers are at positions other than the first via holes in the black matrix layer; and
 a transparent conductive layer arranged on the spacers, wherein the transparent conductive layer is connected with the auxiliary cathode layer through the first via holes and the second via holes.

2. The color film substrate according to claim 1, further comprising a color film layer arranged on the same layer as the black matrix layer.

3. The color film substrate according to claim 1, wherein, the auxiliary cathode layer comprises an auxiliary cathode grid routing, and the auxiliary cathode grid routing corresponds to the black matrix layer and is connected with the transparent conductive layer through the first via holes and the second via holes.

4. The color film substrate according to claim 3, wherein, the first via holes correspond to intersections in the auxiliary cathode grid routing.

5. The color film substrate according to claim 3, wherein, an orthographic projection of the graphic identification on the base substrate is located on a corner of the base substrate.

6. A display panel, comprising a color film substrate in electroluminescent diode, wherein the color film substrate comprises:
 a base substrate;
 an auxiliary cathode layer arranged on the base substrate and configured to couple to a cathode of the electroluminescent diode;
 a black matrix layer arranged on the auxiliary cathode layer, and the black matrix layer comprising a plurality of first via holes penetrating through the black matrix layer in a direction perpendicular to the base substrate to expose the auxiliary cathode layer;
 a flat layer arranged on the black matrix layer, and the flat layer comprising a plurality of second via holes corresponding to the first via holes one by one to expose the auxiliary cathode layer;
 a plurality of spacers arranged at intervals on the flat layer, wherein the spacers are at positions other than the first via holes in the black matrix layer; and
 a transparent conductive layer arranged on the spacers, wherein the transparent conductive layer is connected with the auxiliary cathode layer through the first via holes and the second via holes.

7. A display device, comprising the display panel according to claim 6.

8. A method of fabricating a color film substrate in electroluminescent diode, comprising:
 depositing metal on a base substrate to form a metal layer, and patterning the metal layer to form an auxiliary cathode layer configured to couple to a cathode of the electroluminescent diode;
 forming a black matrix layer on the auxiliary cathode layer, and forming a plurality of first via holes in the black matrix layer penetrating through the black matrix layer in a direction perpendicular to the base substrate to expose the auxiliary cathode layer;
 forming a flat layer on the black matrix layer, and forming a plurality of second via holes in the flat layer corresponding to the first via holes one by one to expose the auxiliary cathode layer;
 forming a plurality of spacers at intervals on the flat layer, wherein the spacers are at positions other than the first via holes in the black matrix layer; and
 forming a transparent conductive layer on the spacers, wherein the transparent conductive layer is connected with the auxiliary cathode layer through the first via holes and the second via holes.

9. The method according to claim 8, wherein, after forming the black matrix layer and before forming the flat layer, the method further comprises: forming a color film layer on the same layer as the black matrix layer.

10. The method according to claim 8, wherein, the auxiliary cathode layer comprises an auxiliary cathode grid routing, and the auxiliary cathode grid routing corresponds to the black matrix layer and is connected with the transparent conductive layer through the first via holes and the second via holes.

11. The color film substrate according to claim 1, wherein the auxiliary cathode layer comprises a graphic identification for alignment.

12. The display panel according to claim 6, wherein the color film substrate further comprises a color film layer arranged on the same layer as the black matrix layer.

13. The display panel according to claim 6, wherein the auxiliary cathode layer comprises an auxiliary cathode grid routing, and the auxiliary cathode grid routing corresponds to the black matrix layer and is connected with the transparent conductive layer through the first via holes and the second via holes.

14. The display panel according to claim 13, wherein, the first via holes correspond to intersections in the auxiliary cathode grid routing.

15. The display panel according to claim 13, wherein an orthographic projection of the graphic identification on the base substrate is located on a corner of the base substrate.

16. The display panel according to claim 6, wherein the auxiliary cathode layer comprises a graphic identification for alignment.

17. The method according to claim 8, wherein the auxiliary cathode layer comprises a graphic identification for alignment.

18. The method according to claim 10, wherein, the first via holes correspond to intersections in the auxiliary cathode grid routing.

19. The method according to claim 10, wherein, an orthographic projection of the graphic identification on the substrate is located on a corner of the base substrate.

\* \* \* \* \*